(12) United States Patent
Park et al.

(10) Patent No.: US 10,438,891 B2
(45) Date of Patent: Oct. 8, 2019

(54) INTEGRATED CIRCUIT DEVICE

(71) Applicant: SAMSUNG ELECTRONICS CO., LTD., Suwon-si, Gyeonggi-do (KR)

(72) Inventors: Sang-jine Park, Suwon-si (KR);
Kee-sang Kwon, Hwaseong-si (KR);
Jae-jik Baek, Seongnam-si (KR);
Yong-sun Ko, Suwon-si (KR);
Kwang-wook Lee, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/697,881

(22) Filed: Sep. 7, 2017

(65) Prior Publication Data

US 2018/0254246 A1 Sep. 6, 2018

(30) Foreign Application Priority Data

Mar. 6, 2017 (KR) .................. 10-2017-0028549

(51) Int. Cl.
| | |
|---|---|
| *H01L 23/532* | (2006.01) |
| *H01L 23/522* | (2006.01) |
| *H01L 29/78* | (2006.01) |
| *H01L 21/768* | (2006.01) |
| *H01L 21/285* | (2006.01) |
| *H01L 21/8234* | (2006.01) |
| *H01L 29/417* | (2006.01) |

(52) U.S. Cl.
CPC .. *H01L 23/53204* (2013.01); *H01L 21/28518* (2013.01); *H01L 21/76847* (2013.01); *H01L 21/76849* (2013.01); *H01L 21/76855* (2013.01); *H01L 21/76879* (2013.01); *H01L 21/76889* (2013.01); *H01L 21/823431* (2013.01); *H01L 21/823475* (2013.01); *H01L 23/5226* (2013.01); *H01L 29/41791* (2013.01); *H01L 29/785* (2013.01)

(58) Field of Classification Search
CPC ................................ H01L 23/53204
See application file for complete search history.

(56) References Cited

U.S. PATENT DOCUMENTS

| 7,863,191 B2 | 1/2011 | Tanaka |
| 9,318,382 B2 | 4/2016 | Kim |

(Continued)

FOREIGN PATENT DOCUMENTS

| KR | 10-1999-0012242 A | 2/1999 |
| KR | 10-0638422 B1 | 10/2006 |
| KR | 10-2014-0028908 A | 3/2014 |

*Primary Examiner* — William A Harriston
(74) *Attorney, Agent, or Firm* — Lee & Morse, P.C.

(57) ABSTRACT

An integrated circuit device includes an insulating film on a substrate, a lower wiring layer penetrating at least a portion of the insulating film, the lower wiring layer including a first metal, a lower conductive barrier film surrounding a bottom surface and a sidewall of the lower wiring layer, the lower conductive barrier film including a second metal different from the first metal, a first metal silicide capping layer covering a top surface of the lower wiring layer, the first metal silicide capping layer including the first metal, and a second metal silicide capping layer contacting the first metal silicide capping layer and disposed on the lower conductive barrier film, the second metal silicide capping layer including the second metal.

17 Claims, 22 Drawing Sheets

(56) References Cited

U.S. PATENT DOCUMENTS

| | | | |
|---|---|---|---|
| 9,466,530 B2 | 10/2016 | Zhang et al. | |
| 9,484,348 B2 | 11/2016 | Basker et al. | |
| 2003/0036263 A1* | 2/2003 | Lin | H01L 21/28562 |
| | | | 438/638 |
| 2013/0249097 A1* | 9/2013 | Yu | H01L 21/76849 |
| | | | 257/751 |

* cited by examiner

INTEGRATED CIRCUIT DEVICE

CROSS-REFERENCE TO RELATED APPLICATION

Korean Patent Application No. 10-2017-0028549, filed on Mar. 6, 2017, in the Korean Intellectual Property Office, and entitled: "Integrated Circuit Device," is incorporated by reference herein in its entirety.

BACKGROUND

1. Field

Embodiments relate to an integrated circuit device, and more particularly, to an integrated circuit device including a metal wiring layer.

2. Description of the Related Art

Due to the development of electronic technology, integrated circuit devices have been down-scaled in recent years, and thus, line widths and pitches of metal wiring layers included in the integrated circuit devices are reduced. Therefore, there is a need to develop an integrated circuit device including a low-resistance metal wiring layer exhibiting improved reliability.

SUMMARY

According to an aspect of embodiments, there is provided an integrated circuit device including an insulating film on a substrate, a lower wiring layer penetrating at least a portion of the insulating film, the lower wiring layer including a first metal, a lower conductive barrier film surrounding a bottom surface and a sidewall of the lower wiring layer, the lower conductive barrier film including a second metal different from the first metal, a first metal silicide capping layer covering a top surface of the lower wiring layer, the first metal silicide capping layer including the first metal, and a second metal silicide capping layer contacting the first metal silicide capping layer and disposed on the lower conductive barrier film, the second metal silicide capping layer including the second metal.

According to another aspect of embodiments, there is provided an integrated circuit device including a fin-type active region protruding upwards from a substrate; a plurality of source/drain regions filling a plurality of recess regions in the fin-type active region, a gate line on the fin-type active region, the gate line extending in a direction intersecting the fin-type active region, a source/drain contact connected to a top surface of one source/drain region from among the plurality of source/drain regions, and a gate contact connected to a top surface of the gate line, wherein at least one of the source/drain contact and the gate contact includes a lower wiring layer including a first metal, a lower conductive barrier film surrounding a bottom surface and a sidewall of the lower wiring layer and including a second metal that is different from the first metal, a first metal silicide capping layer covering a top surface of the lower wiring layer and including the first metal, and a second metal silicide capping layer contacting the first metal silicide capping layer, disposed on the lower conductive barrier film, and including the second metal.

According to yet another aspect of embodiments, there is provided an integrated circuit device including an insulating film on a substrate, a lower wiring layer penetrating at least a portion of the insulating film, the lower wiring layer including a first metal, a lower conductive barrier film surrounding a bottom surface and a sidewall of the lower wiring layer, the lower conductive barrier film including a second metal different from the first metal, a first metal silicide capping layer covering a top surface of the lower wiring layer, the first metal silicide capping layer including the first metal, and a second metal silicide capping layer disposed on a top surface of the lower conductive barrier film and including the second metal, lateral side surfaces of the first and second metal silicide capping layers being contact with each other.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1A:
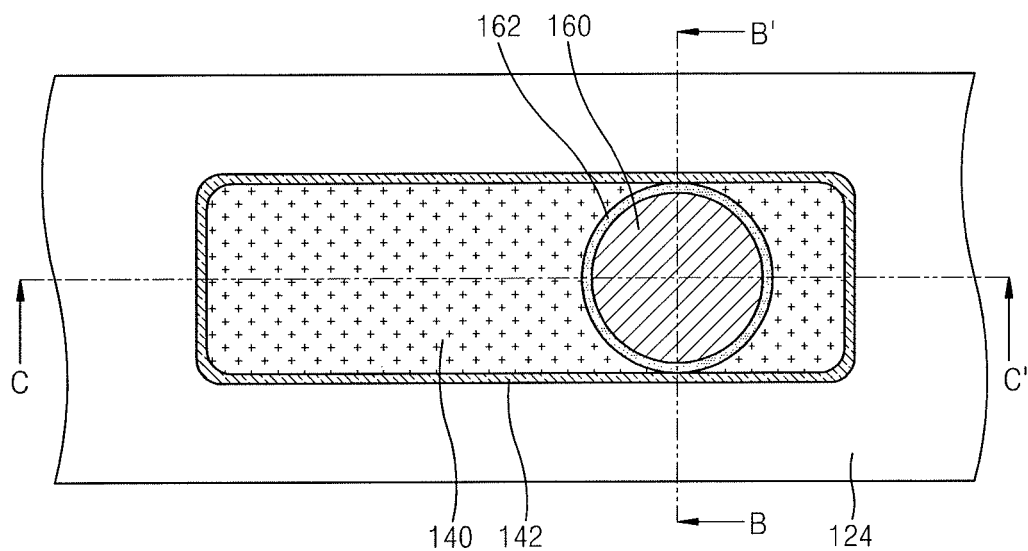
FIG. 1A illustrates a plan view of a planar arrangement of some components of an integrated circuit device according to embodiments.
Figure 1A:
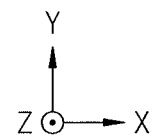

Hereinafter, embodiments will be described in detail with reference to the accompanying drawings. Like components will be denoted by like reference numerals throughout the specification, and repeated descriptions thereof will be omitted.

Figure 1B:
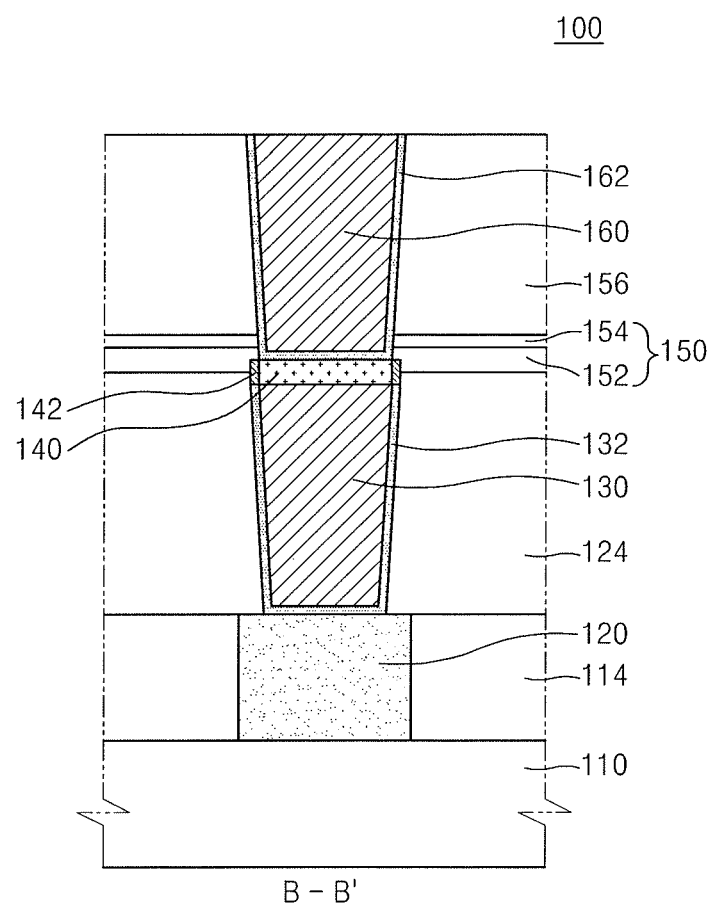
FIG. 1B illustrates a cross-sectional view along line B-B' of FIG. 1A.
Figure 1C:
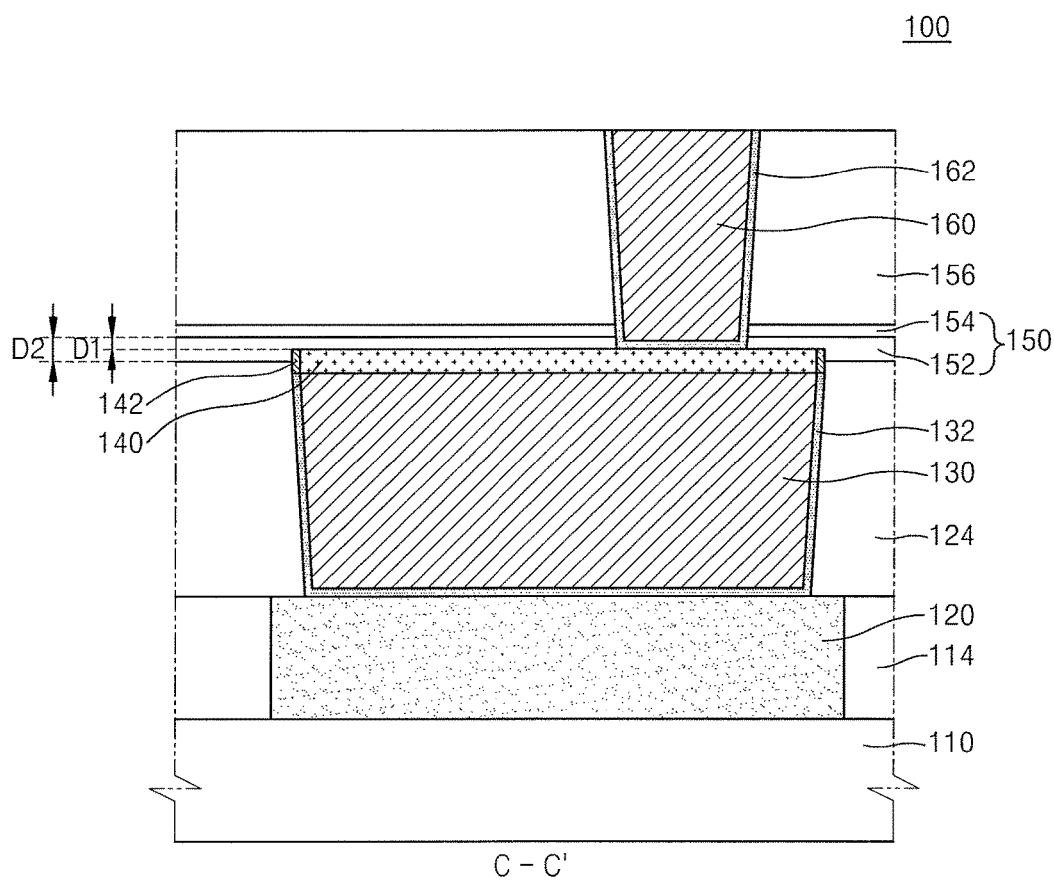
FIG. 1C illustrates a cross-sectional view along line C-C' of FIG. 1A.

FIGS. 1A to 1C are diagrams illustrating an integrated circuit device according to embodiments. FIG. 1A is a plan view illustrating an example of a planar arrangement of some components of an integrated circuit device 100, and FIGS. 1B and 1C are cross-sectional views illustrating main components of the integrated circuit device 100. In particular, FIG. 1B is a cross-sectional view of a portion of the integrated circuit device 100, which corresponds to a cross-section taken along line B-B' of FIG. 1A, and FIG. 1C is a cross-sectional view of a portion of the integrated circuit device 100, which corresponds to a cross-section taken along line C-C' of FIG. 1A Referring to FIGS. 1A to 1C, the integrated circuit device 100 may include a lower wiring layer 130 including a first metal and penetrating at least a portion of a first insulating film 124 over a substrate 110, a lower conductive barrier film 132 surrounding a bottom surface and a sidewall of the lower wiring layer 130 and including a second metal different from the first metal, a first metal silicide capping layer 140 covering a top surface of the lower wiring layer 130 and including the first metal, and a second metal silicide capping layer 142 contacting the first metal silicide capping layer 140, disposed on the lower conductive barrier film 132, and including the second metal.

The substrate 110 may include a semiconductor, e.g., Si or Ge, or a compound semiconductor, e.g., SiGe, SiC, GaAs, InAs, or InP. The substrate 110 may include a conductive region. The conductive region may include an impurity-doped well, an impurity-doped structure, or a conductive layer.

A lower insulating film 114, and a lower conductive film 120 penetrating the lower insulating film 114, may be arranged on the substrate 110. The lower insulating film 114 may include a silicon oxide film. In some embodiments, the lower insulating film 114 may include silicon oxide, e.g., plasma enhanced oxide (PEOX), tetraethyl orthosilicate (TEOS), boro TEOS (BTEOS), phosphorous TEOS (PTEOS), boro phospho TEOS (BPTEOS), boro silicate glass (BSG), phospho silicate glass (PSG), boro phospho silicate glass (BPSG), or the like.

The lower conductive film 120 may be a gate line, a source/drain region, or a wiring layer. In some embodiments, the lower conductive film 120 may be a wiring layer including a metal film and a conductive barrier film surrounding the metal film. The metal film may include, e.g., Co, Cu, W, or Al. The conductive barrier film may include, e.g., Ti, TiN, Ta, TaN, or a combination thereof. In some other embodiments, the lower conductive film 120 may be a source/drain region including a semiconductor epitaxial layer, e.g., an epitaxially grown Si layer, an epitaxially grown SiC layer, or an epitaxially grown SiGe layer, on an active region of the substrate 110. In some further embodiments, the lower conductive film 120 may be a gate line including a work function metal-containing layer on the substrate 110. The work function metal-containing layer may include at least one metal of, e.g., Ti, W, Ru, Nb, Mo, Hf, Ni, Co, Pt, Yb, Tb, Dy, Er, and Pd. The gate line may further include a gap-fill metal film covering the work function metal-containing layer. The gap-fill metal film may include, e.g., a W film or an Al film. In some embodiments, the gate line may include, e.g., a stacked structure of TiAlC/TiN/W, a stacked structure of TiN/TaN/TiAlC/TiN/W, or a stacked structure of TiN/TaN/TiN/TiAlC/TiN/W.

The first insulating film 124 may be formed on the lower insulating film 114, and the lower wiring layer 130 and the lower conductive barrier film 132 may extend to the lower conductive film 120 through the first insulating film 124. A constituent material of the first insulating film 124 is substantially the same as described with respect to the lower insulating film 114.

In some embodiments, the first metal constituting the lower wiring layer 130 may be at least one of, e.g., Co, W, Cu, Ru, Mn, Ti, Ta, and a combination thereof. That is, the lower wiring layer 130 may include, e.g., Co, W, Cu, Ru, Mn, Ti, Ta, or a combination thereof. The first metal silicide capping layer 140 may include a silicide including the first metal. For example, if the first metal is Co, the lower wiring layer 130 may include a Co film, and the first metal silicide capping layer 140 may include a Co silicide film.

The second metal constituting the lower conductive barrier film 132 is a metal that is different from the first metal, and may be, e.g., Ti or Ta. For example, the lower conductive barrier film 132 may include, e.g., Ti, TiN, Ta, TaN, or a combination thereof. The second metal silicide capping layer 142 may include a silicide film including, e.g., Ti or Ta. In some embodiments, the second metal silicide capping layer 142 may include titanium silicide ($TiSi_2$) or tantalum silicide ($TaSi_2$). In some other embodiments, the second metal silicide capping layer 142 may include a combination of $TiSi_2$ and titanium silicon nitride (TiSiN) or a combination of $TaSi_2$ and tantalum silicon nitride (TaSiN).

An insulating capping layer 150 is formed on the first metal silicide capping layer 140, the second metal silicide capping layer 142, and the first insulating film 124. The insulating capping layer 150 may extend to cover a top surface of the first metal silicide capping layer 140, a top surface of the second metal silicide capping layer 142. and a top surface of the first insulating film 124. The insulating capping layer 150 may directly contact each of the top surface of the first metal silicide capping layer 140, the top surface of the second metal silicide capping layer 142, and the top surface of the first insulating film 124.

The insulating capping layer 150 may have a multilayered structure in which a first insulating capping layer 152 and a second insulating capping layer 154 are stacked in this stated order. The insulating capping layer 150 may include a silicon film, a nitride film, a carbide film, or a combination thereof. In some embodiments, the first insulating capping layer 152 may include a silicon film, and the second insulating capping layer 154 may include a nitride film, a carbide film, or a combination thereof. In some embodiments, the second insulating capping layer 154 may include an insulating film including a metal, or a nitride film including no metal. In some embodiments, the second insulating capping layer 154 may include, e.g., silicon nitride (SiN), nitrogen-doped silicon carbide (SiC:N), SiOC, AlN, AlON, AlO, AlOC, or a combination thereof. In one embodiment, the second insulating capping layer 154 may be a single layer including, e.g., SiC, SiN, SiC:N, or SiOC. In another embodiment, the second insulating capping layer 154 may have a structure in which a first layer including, e.g., AlN, AlON, AlO, or AlOC, and a second layer including, e.g., SiC, SiN, SiC:N, or SiOC, are stacked in this stated order.

An upper wiring layer 160 may be formed over the first metal silicide capping layer 140 and contact the first metal silicide capping layer 140 through the insulating capping layer 150. An upper conductive barrier film 162 may be formed on the first metal silicide capping layer 140 and the second metal silicide capping layer 142 and surround a bottom surface and a sidewall of the upper wiring layer 160. The upper wiring layer 160 and the upper conductive barrier film 162 may extend through a second insulating film 156 and the insulating capping layer 150 to contact the first metal silicide capping layer 140. A constituent material of the second insulating film 156 is substantially the same as described with respect to the lower insulating film 114. The upper wiring layer 160 and the upper conductive barrier film 162 may be electrically connected to the lower wiring layer 130 via the first metal silicide capping layer 140.

In some embodiments, the upper wiring layer 160 may include a metal that is different from the first metal constituting the lower wiring layer 130. In some other embodiments, the upper wiring layer 160 may include a metal that is the same as the first metal constituting the lower wiring layer 130. The upper wiring layer 160 may include at least one metal of, e.g., W, Co, Cu, Ru, Mn, Ti, and Ta. For example, the lower wiring layer 130 may include Co, and the upper wiring layer 160 may include W, without being limited thereto. The upper conductive barrier film 162 may include a metal that is different from the metal constituting the upper wiring layer 160. For example, the upper conductive barrier film 162 may include Ti, TiN, Ta, TaN, or a combination thereof.

Each of the first metal silicide capping layer 140 and the second metal silicide capping layer 142 may have a top surface that is at a higher level than the top surface of the first insulating film 124, e.g., relatively to the substrate 110, and may have a bottom surface that is at a lower level than the top surface of the first insulating film 124, e.g., relatively to the substrate 110. Therefore, the top surface of the first metal silicide capping layer 140 may, e.g., directly, contact the upper conductive barrier film 162 at a higher level than the top surface of the first insulating film 124, e.g., relatively to the substrate 110, and the bottom surface of the first metal silicide capping layer 140 may, e.g., directly, contact the lower wiring layer 130 at a lower level than the top surface of the first insulating film 124, e.g., relatively to the substrate 110.

As illustrated in FIG. 1C, each of the first insulating capping layer 152 and the second insulating capping layer 154, which constitute the insulating capping layer 150, may have an approximately flat top surface over the lower wiring layer 130 and the first insulating film 124 surrounding the lower wiring layer 130. A thickness D1 of a portion of the first insulating capping layer 152, which covers the first metal silicide capping layer 140, may be less than a thickness D2 of a portion of the first insulating capping layer 152, which covers the first insulating film 124. A thickness of a portion of the second insulating capping layer 154, which covers the first metal silicide capping layer 140, may be approximately equal to a thickness of a portion of the second insulating capping layer 154, which covers the first insulating film 124. For example, as illustrated in FIG. 1C, the first insulating capping layer 152 may have a larger thickness over the first insulating film 124, as compared to its thickness over the first metal silicide capping layer 140, while the second insulating capping layer 154 may have a uniform thickness.

The second metal silicide capping layer 142 may have a planar shape surrounding, e.g., a perimeter of, the first metal silicide capping layer 140 (FIG. 1A). The upper wiring layer 160 may be arranged over the lower wiring layer 130 to cover, e.g., overlap, a portion of the first metal silicide capping layer 140, e.g., the top surface of the lower wiring layer 130 may be is wider than a bottom surface of the upper wiring layer 160 with the first metal silicide capping layer 140 completely separating therebetween. The first metal silicide capping layer 140 may include a portion between the lower wiring layer 130 and the upper wiring layer 160, and a portion between the lower wiring layer 130 and the insulating capping layer 150 (FIG. 1C). The first metal silicide capping layer 140 may be spaced apart from the first insulating film 124, with the second metal silicide capping layer 142 interposed between the first metal silicide capping layer 140 and the first insulating film 124.

Figure 2:
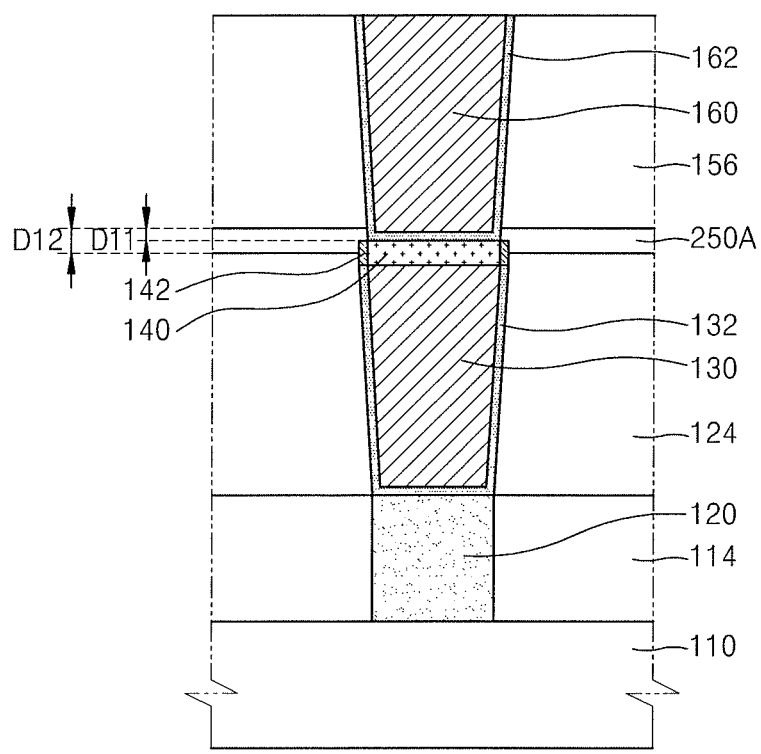
FIGS. 2 to 5 illustrate cross-sectional views of main components of integrated circuit devices according to other embodiments.
Figure 3:
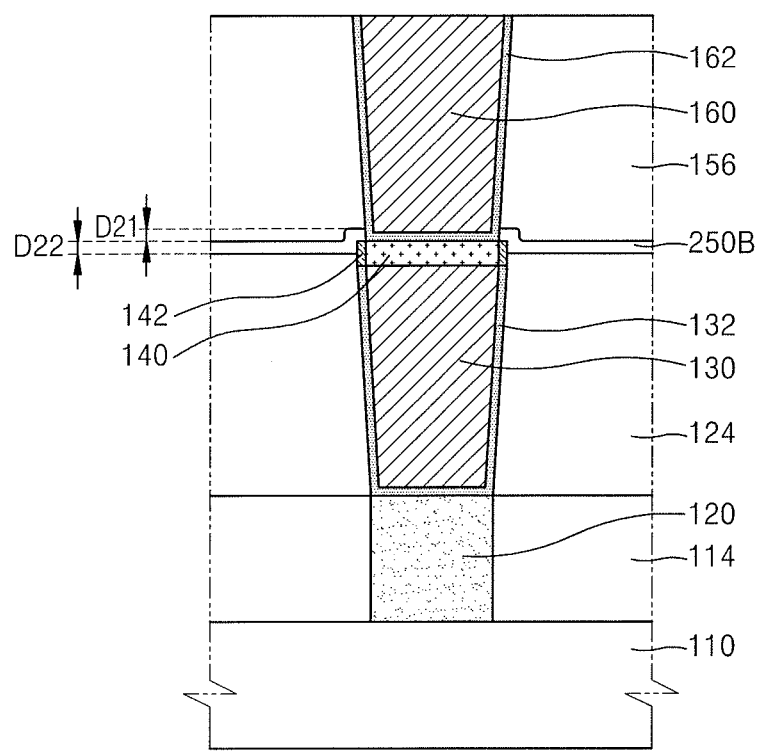

FIGS. 2 and 3 are cross-sectional views illustrating main components of integrated circuit devices, according to other embodiments. FIGS. 2 and 3 respectively illustrate cross-sectional configurations of portions of the integrated circuit devices corresponding to a cross-section taken along line B-B' of FIG. 1A.

Referring to FIGS. 2 and 3, each of integrated circuit devices 200A and 200B has a structure that is substantially the same as that of the integrated circuit device 100 shown in FIG. 1. However, the integrated circuit devices 200A and 200B respectively include insulating capping layers 250A and 250B including a single layer, instead of the insulating capping layer 150 having a multilayered structure.

For example, referring to FIG. 2A, the insulating capping layer 250A has an approximately flat top surface over the lower wiring layer 130 and the first insulating film 124 surrounding the lower wiring layer 130. Thus, a top surface of a portion of the insulating capping layer 250A which covers the first metal silicide capping layer 140, and a top surface of a portion of the insulating capping layer 250A which covers the first insulating film 124, may be at approximately the same level and on approximately the same plane. A thickness D11 of the portion of the insulating capping layer 250A which covers the first metal silicide capping layer 140 may be less than a thickness D12 of the portion of the insulating capping layer 250A which covers the first insulating film 124. The insulating capping layer 250A may contact each of the top surface of the first metal silicide capping layer 140, the top surface of the second metal silicide capping layer 142, and the top surface of the first insulating film 124. In some embodiments, the insulating capping layer 250A may include a silicon film. Descriptions of the insulating capping layer 250A are substantially the same as the descriptions regarding the second insulating capping layer 154 provided with reference to FIGS. 1A to 1C.

In another example, referring to FIG. 3, the insulating capping layer 250B may have a top surface having a step. As shown in FIG. 3, a top surface of a portion of the insulating capping layer 250B which covers the first metal silicide capping layer 140 and the second metal silicide capping layer 142, may be at a higher level than a top surface of a portion of the insulating capping layer 250B which covers first insulating film 124. A thickness D21 of a portion of the insulating capping layer 250B which covers the first metal silicide capping layer 140 may be approximately equal to a thickness D22 of the portion of the insulating capping layer 250B which covers the first insulating film 124. The insulating capping layer 250B may contact each of the top surface of the first metal silicide capping layer 140, the top surface of the second metal silicide capping layer 142, and the top surface of the first insulating film 124. In some embodiments, the insulating capping layer 250B may include, e.g., SiN, SiC:N, SiOC, AlN, AlON, AlO, AlOC, or a combination thereof. In one embodiment, the insulating capping layer 250B may be a single layer including, e.g., SiC, SiN, SiC:N, or SiOC. In another embodiment, the insulating capping layer 250B may have a structure in which a first layer including, e.g., AlN, AlON, AlO, or AlOC and a second layer including, e.g., SiC, SiN, SiC:N, or SiOC, are stacked in this stated order. Descriptions of the insulating capping layer 250B are substantially the same as the descriptions regarding the second insulating capping layer 154 provided with reference to FIGS. 1A to 1C.

In the integrated circuit devices 200A and 200B shown in FIGS. 2 and 3, although the first metal silicide capping layer 140, the second metal silicide capping layer 142, the upper wiring layer 160, and the upper conductive barrier film 162 may respectively have planar structures that are the same as or similar to those illustrated in FIG. 1A, embodiments are not limited thereto, and various changes and modifications may be made therefrom.

Figure 4:
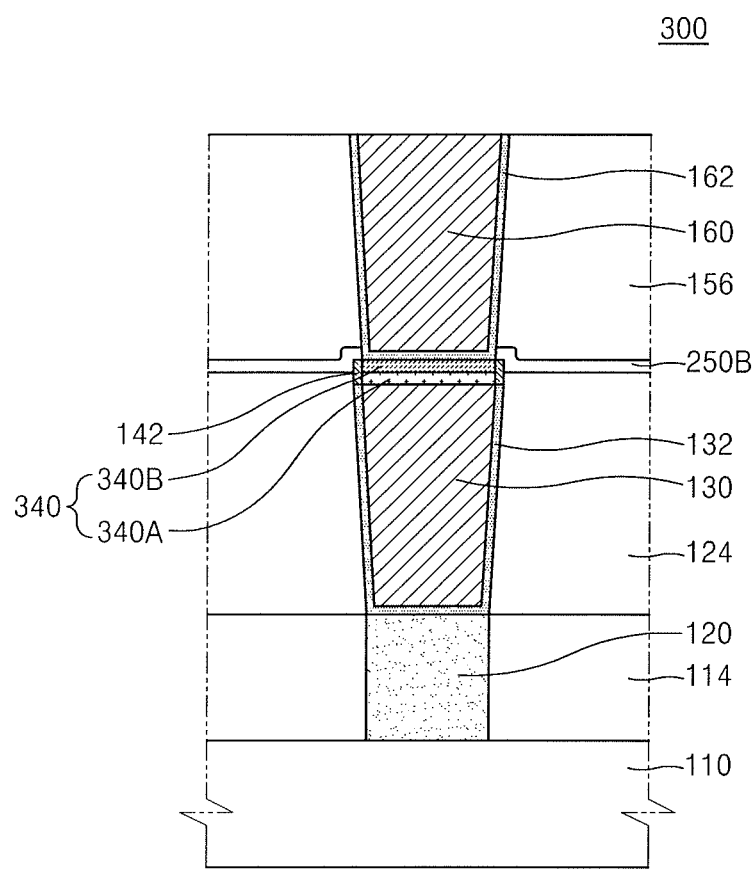

FIG. 4 is a cross-sectional view illustrating main components of an integrated circuit device, according to further embodiments.

Referring to FIG. 4, an integrated circuit device 300 may have substantially the same configuration as the integrated circuit device 200B shown in FIG. 3. However, the integrated circuit device 300 includes a first metal silicide capping layer 340 having a multilayered structure, instead of the first metal silicide capping layer 140 having a single-layered structure.

In detail, the first metal silicide capping layer 340 may include a first lower metal silicide capping layer 340A, which includes a metal that is the same as the first metal included in the lower wiring layer 130, and a first upper metal silicide capping layer 340B, which includes a metal that is different from the first metal. For example, the lower wiring layer 130 may include Co, the first lower metal silicide capping layer 340A may include Co silicide, and the first upper metal silicide capping layer 340B may include Ti silicide or Ta silicide. However, embodiments are not limited thereto, and various changes and modifications may be made without departing from the scope of the above description.

Figure 5:
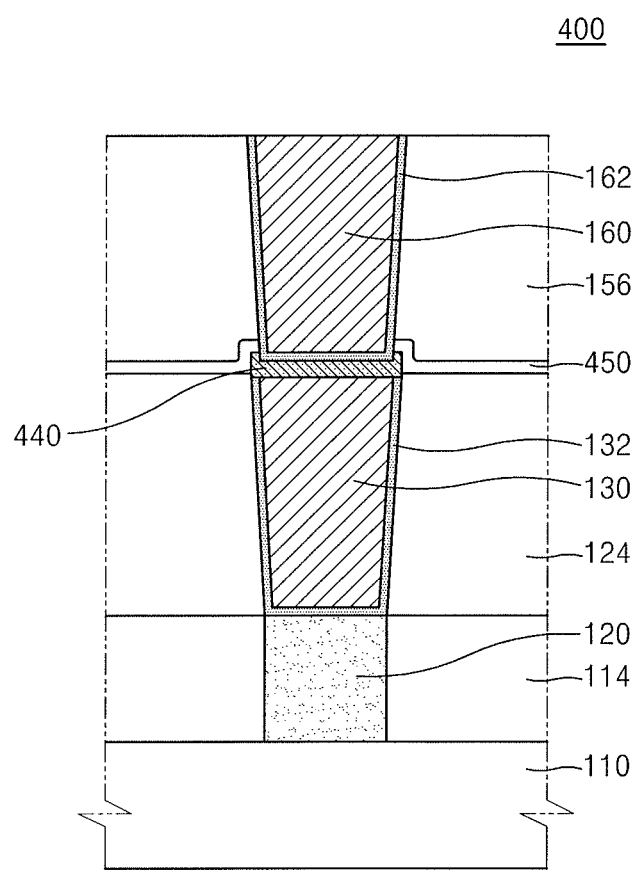

FIG. 5 is a cross-sectional view illustrating main components of an integrated circuit device, according to yet other embodiments.

Referring to FIG. 5, an integrated circuit device 400 may have substantially the same configuration as the integrated circuit device 200B shown in FIG. 3. However, in the integrated circuit device 400, the lower wiring layer 130 and the lower conductive barrier film 132 are covered with a metal capping layer 440. The metal capping layer 440 may include a metal that is different from the first metal constituting the lower wiring layer 130 and also different from the second metal constituting the lower conductive barrier film 132. For example, when the lower wiring layer 130 includes Co and the lower conductive barrier film 132 includes Ti or Ta, the metal capping layer 440 may include W.

An insulating capping layer 450 may extend to cover a top surface of the metal capping layer 440 and the top surface of the first insulating film 124. The insulating capping layer 450 may directly contact the top surface of the metal capping layer 440 and the top surface of the first insulating film 124. In some embodiments, the insulating capping layer 450 may include, e.g., SiN, SiC:N, SiOC, AlN, AlON, AlO, AlOC, or a combination thereof. Descriptions of the insulating capping layer 450 are substantially the same as the descriptions regarding the second insulating capping layer 154 provided with reference to FIGS. 1A to 1C.

The upper wiring layer 160, and the upper conductive barrier film 162 surrounding the bottom surface and the sidewall of the upper wiring layer 160, may be formed on the metal capping layer 440. The upper wiring layer 160 and the upper conductive barrier film 162 may extend through the second insulating film 156 and the insulating capping layer 450 to contact the metal capping layer 440, and may be connected to the lower wiring layer 130 via the metal capping layer 440.

Each of the integrated circuit devices 100, 200A, 200B, 300, and 400 described with reference to FIGS. 1A to 5 may include a metal-containing conductive capping layer between the lower wiring layer 130 and the upper wiring layer 160. The metal-containing conductive capping layer may include the first metal silicide capping layer 140, the second metal silicide capping layer 142, the first metal silicide capping layer 340 having a multilayered structure, or the metal capping layer 440, as shown in FIGS. 1A to 5, or a combination thereof. The metal-containing conductive capping layer may protect the lower wiring layer 130 from being exposed or damaged during formation of a contact hole accommodating the upper wiring layer 160. Thus, a resistance increase, leakage current, or the like in the lower wiring layer 130 may be suppressed by suppressing physical deterioration of the lower wiring layer 130, whereby the reliability of the integrated circuit devices may be improved.

FIGS. 6A to 6G are cross-sectional views illustrating sequential processes of examples of a method of fabricating an integrated circuit device, according to embodiments. A method of fabricating the integrated circuit device 100 shown in FIGS. 1A to 1C will be described with reference to FIGS. 6A to 6G. It is noted that FIGS. 6A to 6G correspond to the cross-section illustrated in FIG. 1B.

Figure 6A:
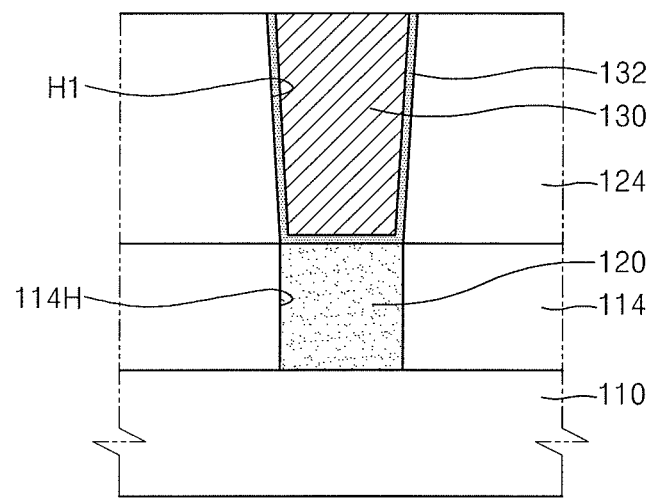
FIGS. 6A to 6G illustrate cross-sectional views of stages in a method of fabricating an integrated circuit device according to embodiments.

Referring to FIG. 6A, the lower insulating film 114 may be formed on the substrate 110, followed by forming an opening 114H which exposes a conductive region of the substrate 110 by etching a portion of the lower insulating film 114. Then, the lower conductive film 120 may be formed by filling the opening 114H with a conductive material.

The first insulating film 124 may be formed on the lower insulating film 114 and the lower conductive film 120, followed by forming a first hole H1 which penetrates through the first insulating film 124 and exposes the lower conductive film 120. Next, the lower conductive barrier film 132 may be, e.g., conformally, formed in the first hole H1 and on the top surface of the first insulating film 124, followed by forming the lower wiring layer 130 on the lower conductive barrier film 132 so as to fill the first hole H1. Next, the resultant product thus obtained may be planarized by a chemical mechanical polishing (CMP) process and/or an etch-back process, thereby exposing the top surface of the first insulating film 124. In some embodiments, the first hole H1 may have various planar shapes, e.g., an island shape, a line shape, and the like.

Figure 6B:
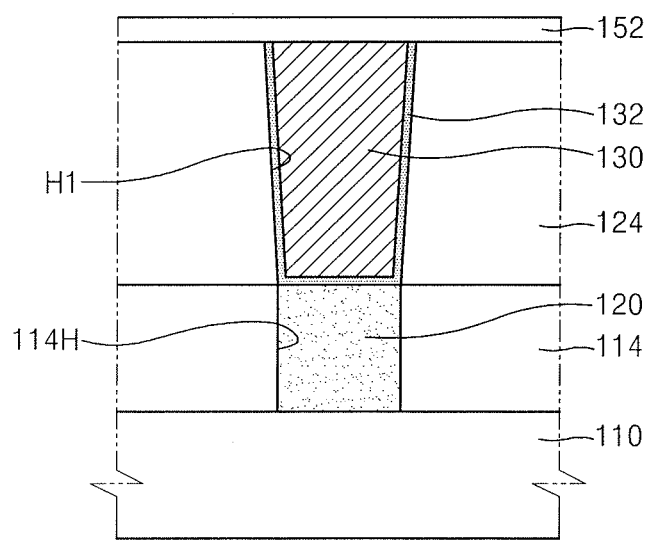

Referring to FIG. 6B, the first insulating capping layer 152 is formed covering the lower wiring layer 130, the lower conductive barrier film 132, and the first insulating film 124, e.g., the first insulating capping layer 152 may be formed to overlap the entire substrate 110 and may have a substantially uniform thickness. In some embodiments, the first insulating capping layer 152 may include a silicon film. To form the first insulating capping layer 152, a chemical vapor deposition (CVD) or atomic layer deposition (ALD) process may be used.

Figure 6C:
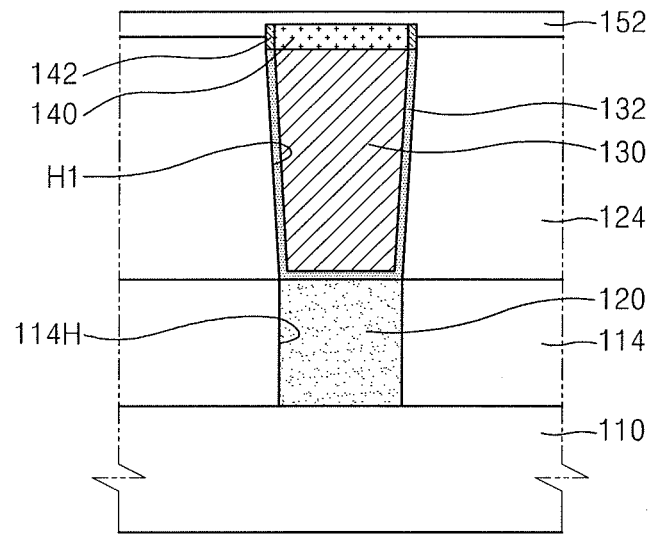

Referring to FIG. 6C, the resultant product of FIG. 6B including the first insulating capping layer 152 undergoes heat treatment. As a result, portions of the first insulating capping layer 152, the lower wiring layer 130, and the lower conductive barrier film 132 form the first metal silicide capping layer 140 and the second metal silicide capping layer 142. That is, the heat treatment causes, e.g., silicidation, so a reaction between the metal constituting the lower wiring layer 130 and silicon atoms constituting the first insulating capping layer 152, and a reaction between the metal constituting the lower conductive barrier film 132 and the silicon atoms constituting the first insulating capping layer 152 forms the first metal silicide capping layer 140 and the second metal silicide capping layer 142. After the first metal silicide capping layer 140 and the second metal silicide capping layer 142 are formed, an unreacted portion of the first insulating capping layer 152 may remain on each of the first metal silicide capping layer 140, the second metal silicide capping layer 142, and the first insulating film 124.

For example, the heat treatment may be performed at a temperature of about 300° C. to about 400° C. and a pressure of about 1 torr to about 20 torr for about 1 second to about 1 minute. However, examples are not limited thereto. In some embodiments, after the heat treatment, although at least one of the first metal silicide capping layer 140 and the second metal silicide capping layer 142 may not be in a stable phase, the at least one of the first metal silicide capping layer 140 and the second metal silicide capping layer 142 may reach a stable phase due to a thermal budget applied thereto through a subsequent process.

When the lower wiring layer 130 includes the first metal, the first metal silicide capping layer 140 may include a material represented by $M_xSi_y$ (where M is the first metal, x is an integer of 1 to 6, and y is an integer of 1 to 10). For example, the lower wiring layer 130 may include Co, and the first metal silicide capping layer 140 may include CoSi, $CoSi_2$, $Co_2Si$, $Co_3Si$, or the like, without being limited thereto. When the lower conductive barrier film 132 includes a double layer of Ti/TiN, the second metal silicide capping layer 142 may include a portion including $TiSi_2$ and a portion including TiSiN.

Figure 6D:
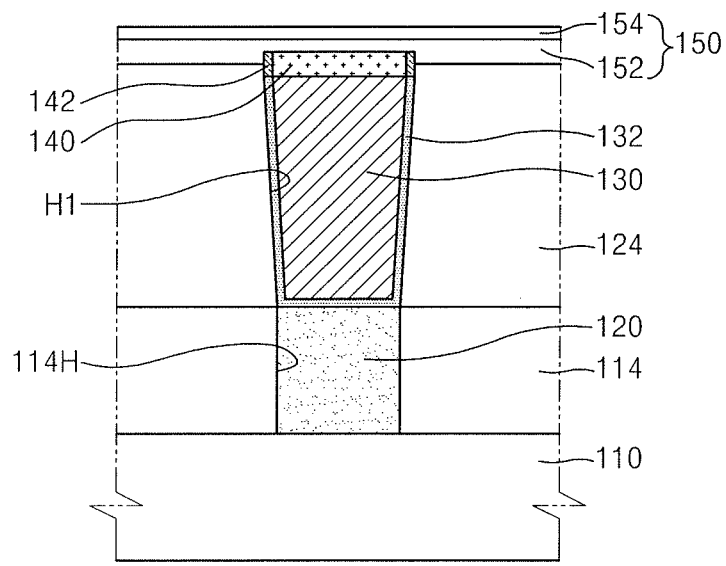

Referring to FIG. 6D, the second insulating capping layer 154 may be formed on the first insulating capping layer 152. The second insulating capping layer 154 may have a constant thickness on the first insulating capping layer 152. The second insulating capping layer 154 may include, e.g., SiN, SiC:N, SiOC, AlN, AlON, AlO, AlOC, or a combination thereof. The second insulating capping layer 154 may have a single-layered structure including a single material, or a multilayered structure in which at least two material layers are sequentially stacked. To form the second insulating capping layer 154, e.g., a CVD process, an ALD process, a sputtering process, or a combination thereof may be used.

Figure 6E:
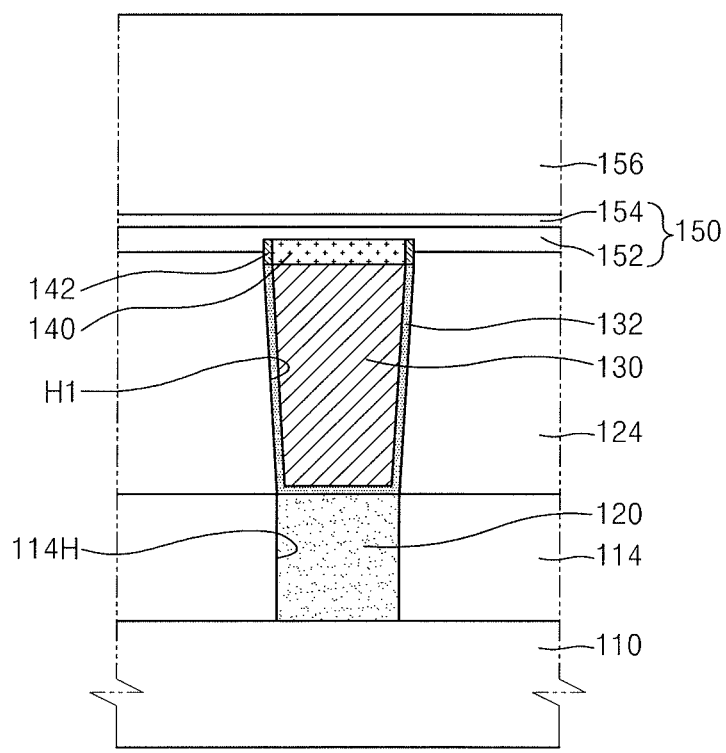

Referring to FIG. 6E, the second insulating film 156 may be formed to cover the second insulating capping layer 154.

Figure 6F:
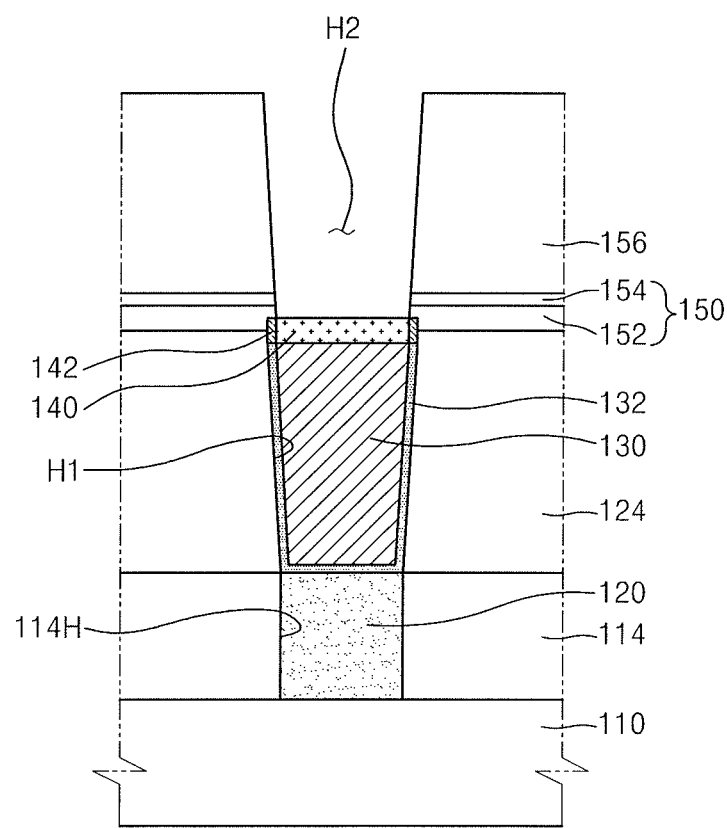

Referring to FIG. 6F, the second insulating film 156 may be etched by using the insulating capping layer 150 as an etch stop layer, thereby forming a second hole H2 which exposes the first metal silicide capping layer 140. In some embodiments, to form the second hole H2, the second insulating film 156 and the insulating capping layer 150 may be dry-etched by a plasma etching or reactive ion etching (RIE) process, and then undergo a cleaning process using pure water.

After the insulating capping layer 150 is etched to form the second hole H2, the first metal silicide capping layer 140 may be exposed by the second hole H2. While the first metal silicide capping layer 140 may be exposed by the second hole H2 to residue, e.g., acidic materials such as HF which may remain on the resultant product after the etching and cleaning processes of the second insulating film 156 and the insulating capping layer 150, the first metal silicide capping layer 140 may be prevented from being unintentionally etched or consumed by the residue due to the relatively high etching resistance of the first metal silicide capping layer 140 with respect to the residue.

In addition, during the formation of the second hole H2, the lower wiring layer 130 may be protected by the first metal silicide capping layer 140, and there is no concern that the lower wiring layer 130 could be exposed to an atmosphere of the etching and cleaning processes of the second insulating film 156 and the insulating capping layer 150. Therefore, the lower wiring layer 130 may be prevented from being unintentionally etched or consumed by the residue. As a result, physical deterioration of the lower wiring layer 130 due to the residue may be suppressed during the formation of the second hole H2, and thus, a resistance increase, leakage current, or the like in the lower wiring layer 130 may be suppressed, thereby improving the reliability of a wiring structure including the lower wiring layer 130.

Figure 6G:
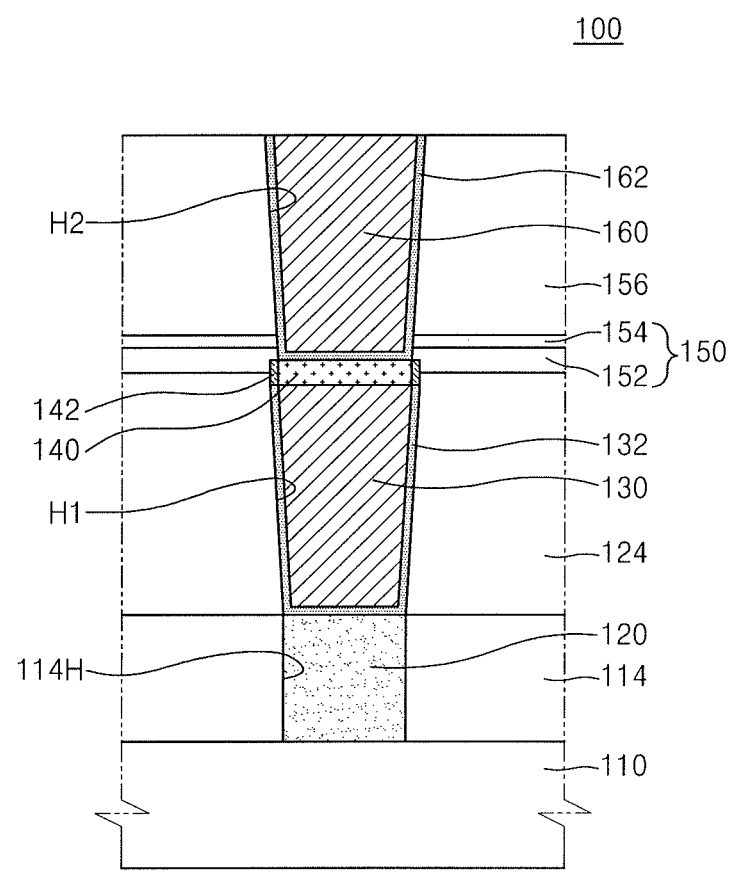

Referring to FIG. 6G, the upper conductive barrier film 162 may be, e.g., conformally, formed in the second hole H2. Then, the upper wiring layer 160 may be formed on the upper conductive barrier film 162 to fill the second hole H2.

Although the method of fabricating the integrated circuit device 100 shown in FIGS. 1A to 1C has been described with reference to FIGS. 6A to 6G, it will be understood by those skilled in the art that the integrated circuit devices 200A, 200B, 300, and 400 shown in FIGS. 2 to 5 may be fabricated by the method described with reference to FIGS. 6A to 6G, or methods changed or modified therefrom, without departing from the scope of the above described method.

For example, in an example of a method of fabricating the integrated circuit device 200A shown in FIG. 2, the first metal silicide capping layer 140 and the second metal silicide capping layer 142 may be formed in the same manner as described with reference to FIGS. 6A to 6C. As a result, an unreacted portion of the first insulating capping layer 152 shown in FIG. 6C may remain on the first metal silicide capping layer 140 and the second metal silicide capping layer 142. The unreacted portion of the first insulating capping layer 152 may constitute the insulating capping layer 250A shown in FIG. 2. Next, the process of forming the second insulating capping layer 154, which has been described with reference to FIG. 6D, may be omitted, and the second insulating film 156 may be directly formed on the insulating capping layer 250A. Next, the processes described with reference to FIGS. 6F and 6G may be performed.

Figure 7A:
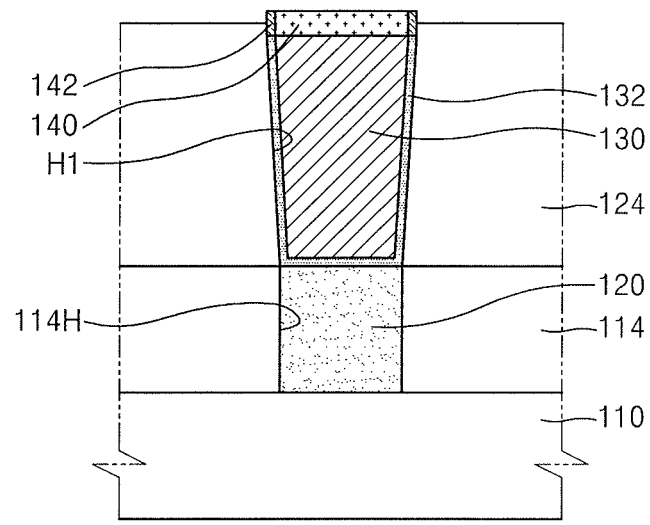
FIGS. 7A to 7C illustrate cross-sectional views of stages in a method of fabricating an integrated circuit device according to embodiments.
Figure 7B:
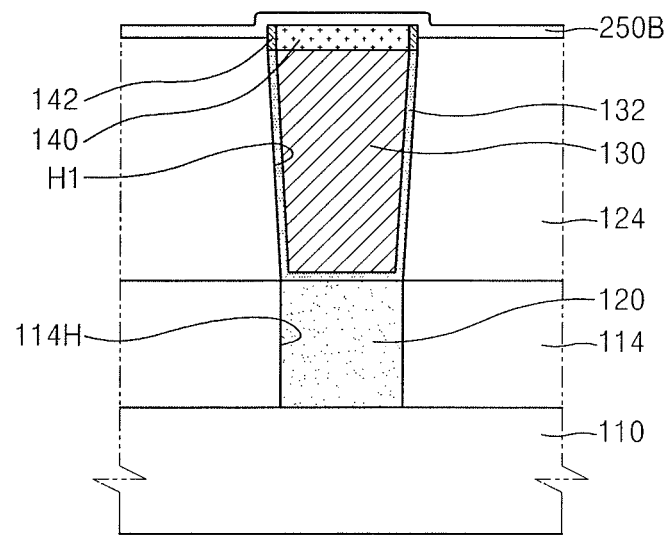
Figure 7C:
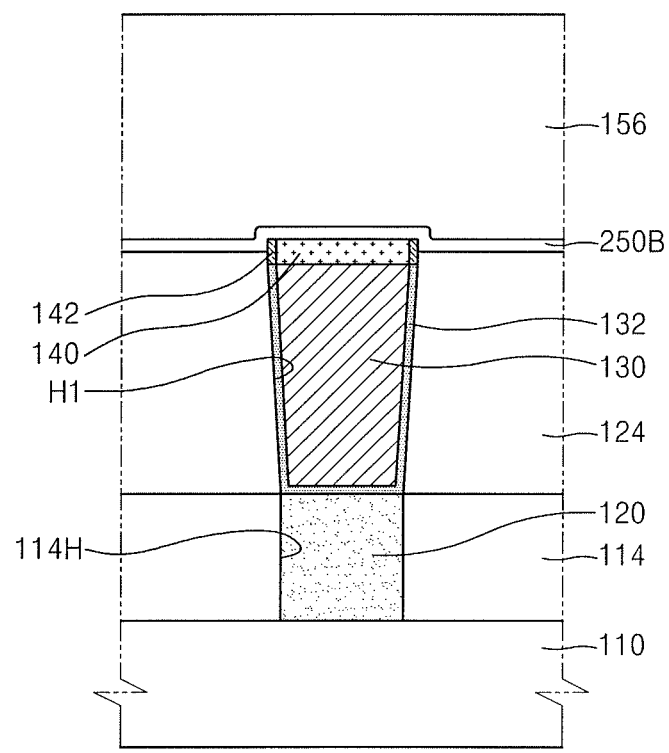

FIGS. 7A to 7C are cross-sectional views illustrating sequential processes of other examples of a method of fabricating an integrated circuit device, according to embodiments. An example of a method of fabricating the integrated circuit device 200B shown in FIG. 3 will be described with reference to FIGS. 7A to 7C.

Referring to FIG. 7A, after the first metal silicide capping layer 140 and the second metal silicide capping layer 142 are formed in the same manner as described with reference to FIGS. 6A to 6C, the first insulating capping layer 152 remaining unreacted on the second metal silicide capping layer 142 may be removed, thereby exposing the top surface of each of the first metal silicide capping layer 140, the second metal silicide capping layer 142, and the first insulating film 124.

Referring to FIG. 7B, the insulating capping layer 250B is formed to cover the first metal silicide capping layer 140, the second metal silicide capping layer 142, and the first insulating film 124. The insulating capping layer 250B may conformally cover the exposed surface of each of the first metal silicide capping layer 140, the second metal silicide capping layer 142, and the first insulating film 124. To form the insulating capping layer 250B, a CVD process, an ALD process, a sputtering process, or a combination thereof may be used.

Referring to FIG. 7C, the second insulating film 156 may be directly formed on the insulating capping layer 250B. Next, the processes described with reference to FIGS. 6F and 6G may be performed.

Figure 8A:
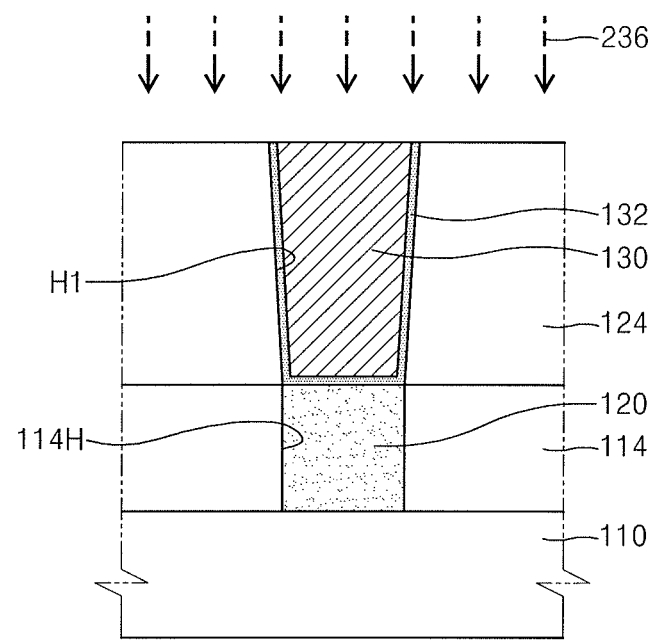
FIGS. 8A to 8C illustrate cross-sectional views of stages in a method of fabricating an integrated circuit device according to embodiments.
Figure 8B:
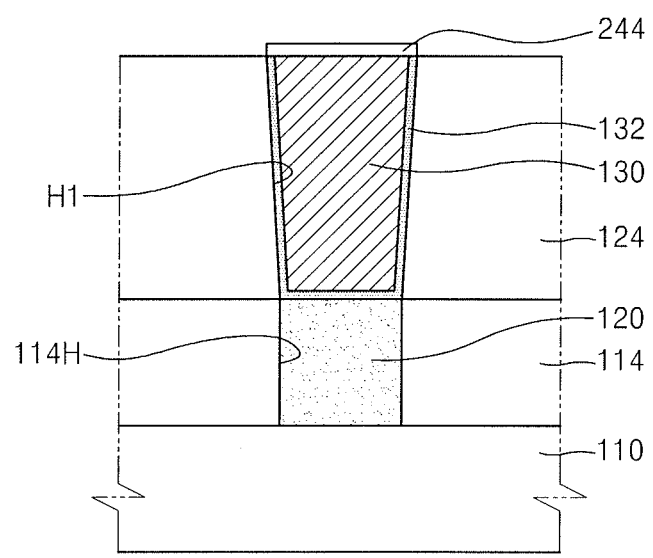
Figure 8C:
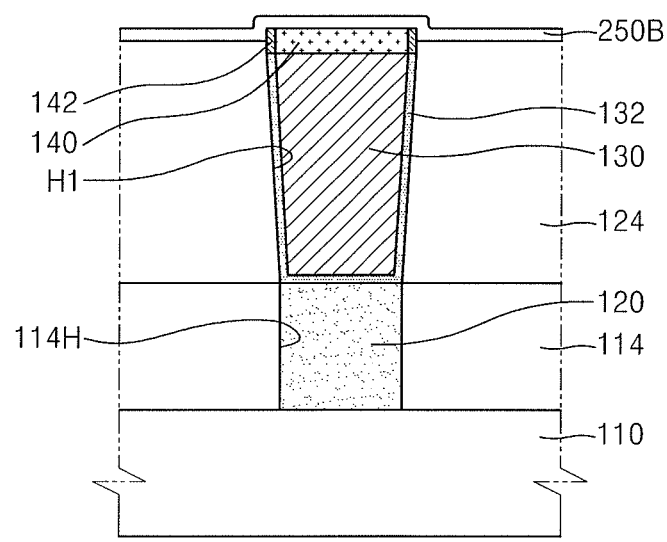

FIGS. 8A to 8C are cross-sectional views illustrating sequential processes of further examples of a method of fabricating an integrated circuit device, according to embodiments. Another example of the method of fabricating the integrated circuit device 200B shown in FIG. 3 will be described with reference to FIGS. 8A to 8C.

Referring to FIG. 8A, the lower insulating film 114 and the lower conductive film 120 may be formed on the substrate 110 in the same manner as described with reference to FIG. 6A, and the first insulating film 124, the lower conductive barrier film 132, and the lower wiring layer 130, which are planarized, may be formed on the lower insulating film 114 and the lower conductive film 120.

Next, the resultant product thus obtained may be annealed in a reducing gas atmosphere 236. In some embodiments, the reducing gas atmosphere 236 may be a $H_2$ gas atmosphere. In some other embodiments, the reducing gas atmosphere 236 may be an atmosphere of a gas mixture of $H_2$ gas and an inert gas, e.g., Ar, He, Ne, $N_2$, or the like. A plasma atmosphere may be formed by applying RF power during the annealing of the resultant product in the reducing gas atmosphere 236, as needed.

When the lower wiring layer 130 includes Co, the resultant product including the lower wiring layer 130 is annealed in the reducing gas atmosphere 236, whereby cobalt oxide unintentionally remaining on an exposed surface of the lower wiring layer 130 may be removed by reduction, and surface damage of the lower wiring layer 130 may be healed, e.g., repaired. The annealing in the reducing gas atmosphere 236 may be performed at a temperature of about 300° C. to about 400° C. and a pressure of about 1 torr to about 20 torr for about 1 second to about 1 minute. For example, the annealing in the reducing gas atmosphere 236 may be performed at a temperature of about 360° C. and a pressure of about 2.4 torr for about 30 seconds. However, these conditions are merely examples, and embodiments are not limited thereto.

Referring to FIG. 8B, a sacrificial silicon film 244 is selectively formed on the lower wiring layer 130 and the lower conductive barrier film 132. The sacrificial silicon film 244 may be selectively formed only on an exposed surface of each of the lower wiring layer 130 and the lower conductive barrier film 132, without being formed on the exposed surface of the first insulating film 124. In some embodiments, to form the sacrificial silicon film 244, a soaking process for exposing top surfaces of the lower wiring layer 130 and the lower conductive barrier film 132 to a silicon-containing gas may be performed. The silicon-containing gas may be at least one of $SiH_4$, $Si_2H_6$, and derivatives thereof. The soaking process may be performed at a temperature of about 200° C. to about 500° C. and a pressure of about 1 torr to about 20 torr, without being limited thereto. The soaking process may be performed in situ subsequent to the annealing process in the reducing gas atmosphere 236, the annealing process having been described with reference to FIG. 8A.

Referring to FIG. 8C, the insulating capping layer 250B is formed covering an exposed surface of the sacrificial silicon film 244 (see FIG. 8B) and the exposed surface of the first insulating film 124, followed by heat treatment of the resultant product thus obtained. In some embodiments, the process of forming the insulating capping layer 250B may be performed in situ subsequent to the soaking process described with reference to FIG. 8B.

The insulating capping layer 250B may conformally cover the exposed surface of the sacrificial silicon film 244 and the exposed surface of the first insulating film 124. To form the insulating capping layer 250B, a CVD process or an ALD process may be used. A deposition process for forming the insulating capping layer 250B may be performed at a temperature that is higher than the temperature of the soaking process described with reference to FIG. 8B. For example, the deposition process for forming the insulating capping layer 250B may be performed at a temperature of about 400° C. to about 800° C. Due to a relatively high temperature of a process for forming the insulating capping layer 250B, a reaction between silicon atoms of the sacrificial silicon film 244 and atoms constituting the lower wiring layer 130 and the lower conductive barrier film 132 may be induced, and as a result, the first metal silicide capping layer 140 and the second metal silicide capping layer 142 may be formed. In some other embodiments, after the insulating capping layer 250B is formed, the first metal silicide capping layer 140 and the second metal silicide capping layer 142 may be formed by performing a separate heat treatment process for inducing a silicidation reaction. Although the insulating capping layer 250B may include SiN, SiC:N, SiOC, or a combination thereof, embodiments are not limited thereto.

Next, the second insulating film 156 may be directly formed on the insulating capping layer 250B according to the method described with reference to FIG. 6E, and the processes described with reference to FIGS. 6F and 6G may be performed.

FIGS. 9A to 9D are cross-sectional views illustrating sequential processes of yet other examples of a method of fabricating an integrated circuit device, according to embodiments. An example of a method of fabricating the integrated circuit device 300 shown in FIG. 4 will be described with reference to FIGS. 9A to 9D.

Figure 9A:
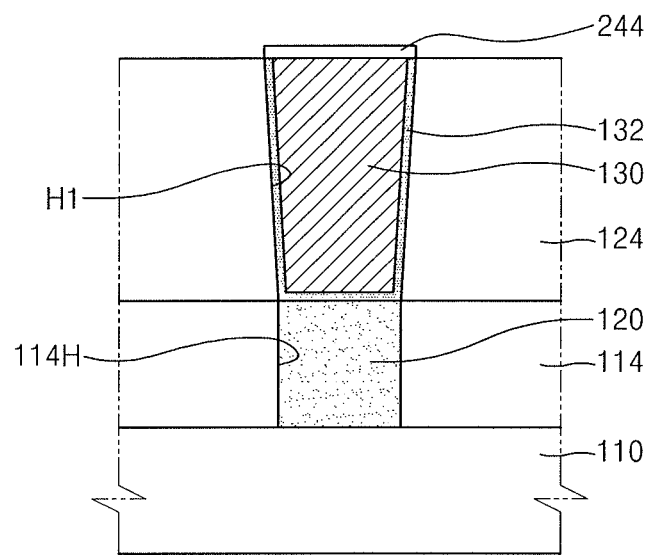
FIGS. 9A to 9D illustrate cross-sectional views of stages in a method of fabricating an integrated circuit device according to embodiments.

Referring to FIG. 9A, in the same manner as described with reference to FIGS. 8A and 8B, the resultant product, in which the lower conductive barrier film 132 and the lower wiring layer 130 are formed over the substrate 110, is annealed in the reducing gas atmosphere 236, followed by selectively forming the sacrificial silicon film 244 on the lower wiring layer 130 and the lower conductive barrier film 132.

Figure 9B:
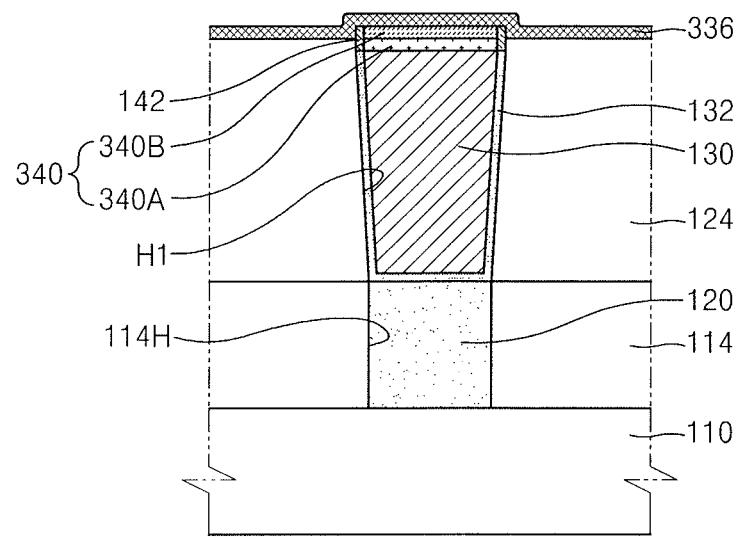

Referring to FIG. 9B, a metal-containing sacrificial film 336 is formed covering the exposed surface of the sacrificial silicon film 244 (see FIG. 9A) and the exposed surface of the first insulating film 124. The metal-containing sacrificial film 336 may include a metal that is different from the first metal included in the lower wiring layer 130. In some embodiments, the lower wiring layer 130 may include Co, and the metal-containing sacrificial film 336 may include, e.g., Ti, TiN, Ta, or TaN.

To form the metal-containing sacrificial film 336, a CVD process or an ALD process may be used. A deposition process for forming the metal-containing sacrificial film 336 may be performed at a temperature that is higher than the temperature of the soaking process for forming the sacrificial silicon film 244 shown in FIG. 9A. For example, the deposition process for forming the metal-containing sacrificial film 336 may be performed at a temperature of about 400° C. to about 800° C. Due to a relatively high temperature of a process for forming the metal-containing sacrificial film 336, a reaction between silicon atoms of the sacrificial silicon film 244 and metal atoms constituting the lower wiring layer 130 and the lower conductive barrier film 132 under the sacrificial silicon film 244, and a reaction between the silicon atoms of the sacrificial silicon film 244 and metal atoms constituting the metal-containing sacrificial film 336 on the sacrificial silicon film 244, may be induced, whereby the first lower metal silicide capping layer 340A, the first upper metal silicide capping layer 340B, and the second metal silicide capping layer 142 may be formed. In some other embodiments, after the metal-containing sacrificial film 336 is formed, the first lower metal silicide capping layer 340A, the first upper metal silicide capping layer 340B, and the second metal silicide capping layer 142 may be formed by performing a separate heat treatment process for deriving a silicidation reaction.

Figure 9C:
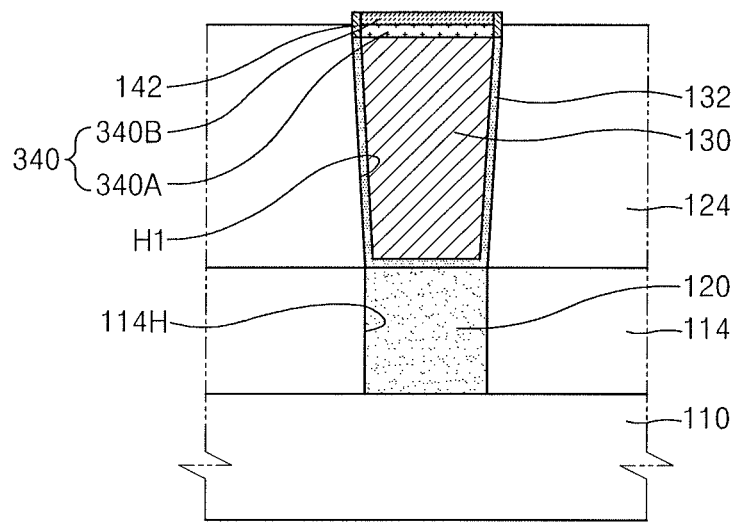

Referring to FIG. 9C, the unreacted metal-containing sacrificial film 336 may be removed from the result product of FIG. 9B, thereby exposing the first upper metal silicide capping layer 340B, the second metal silicide capping layer 142, and the first insulating film 124. In some embodiments, to remove the metal-containing sacrificial film 336, a wet etching process using hydrogen peroxide may be performed.

Figure 9D:
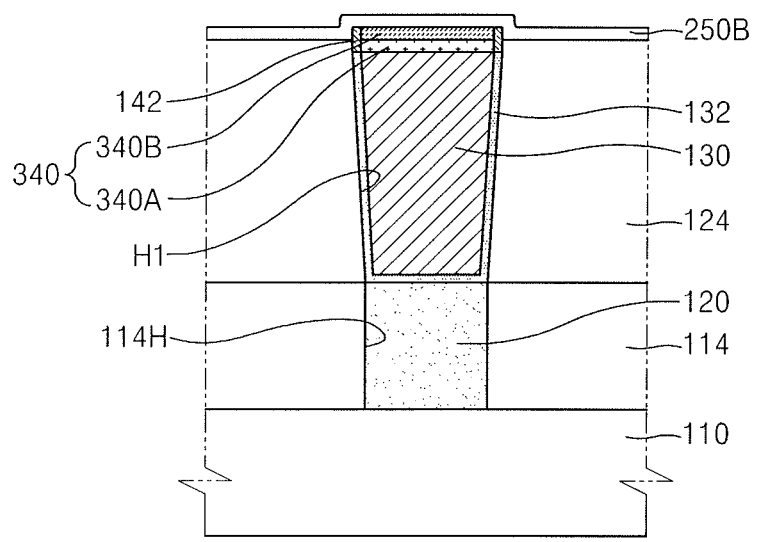

Referring to FIG. 9D, in a similar manner to that described with reference to FIG. 8C, the insulating capping layer 250B may be formed to cover an exposed surface of each of the first upper metal silicide capping layer 340B, the second metal silicide capping layer 142, and the first insulating film 124. The insulating capping layer 250B may conformally cover the exposed surface of each of the first upper metal silicide capping layer 340B, the second metal silicide capping layer 142, and the first insulating film 124.

Next, the second insulating film 156 may be directly formed on the insulating capping layer 250B according to the method described with reference to FIG. 6E. Next, the processes described with reference to FIGS. 6F and 6G may be performed.

Figure 10A:
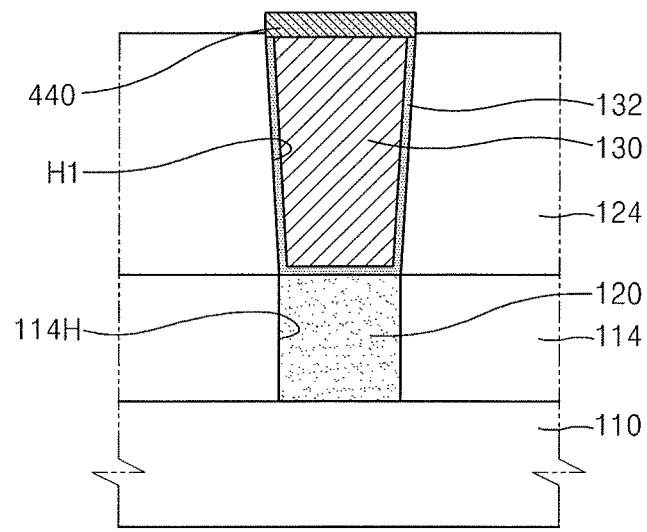
FIGS. 10A and 10B illustrate cross-sectional views of stages in a method of fabricating an integrated circuit device according to embodiments.
Figure 10B:
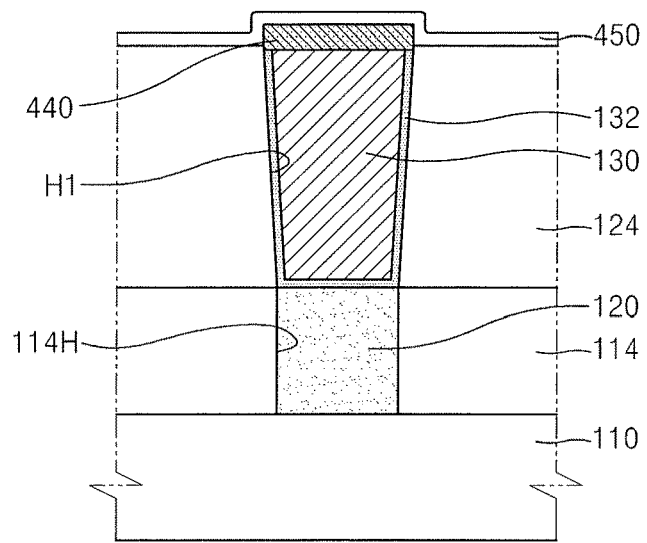

FIGS. 10A and 10B are cross-sectional views illustrating sequential processes of yet other examples of a method of fabricating an integrated circuit device according to embodiments. An example of a method of fabricating the integrated circuit device 400 shown in FIG. 5 will be described with reference to FIGS. 10A and 10B.

Referring to FIG. 10A, in the same manner as described with reference to FIG. 8A, the result product, in which the lower conductive barrier film 132 and the lower wiring layer 130 are formed over the substrate 110, is annealed in the reducing gas atmosphere 236, followed by selectively forming the metal capping layer 440 on the lower wiring layer 130 and the lower conductive barrier film 132. The metal capping layer 440 may include a metal that is not included in the lower wiring layer 130 and the lower conductive barrier film 132. In some embodiments, the metal capping layer 440 may include a refractory metal. For example, the lower wiring layer 130 may include Co, and the metal capping layer 440 may include W. To form the metal capping layer 440, a selective CVD process may be used. The process of forming the metal capping layer 440 may be performed in situ subsequent to the annealing process in the reducing gas atmosphere 236 as described with reference to FIG. 8A.

Referring to FIG. 10B, the insulating capping layer 450 may be formed to cover an exposed surface of each of the metal capping layer 440 and the first insulating film 124. For descriptions of a method of forming the insulating capping layer 450, reference may be made to the descriptions made with reference to FIG. 7B regarding the method of forming the insulating capping layer 250B. The insulating capping layer 450 may conformally cover the exposed surface of each of the metal capping layer 440 and the first insulating film 124.

Next, the second insulating film 156 may be directly formed on the insulating capping layer 450 according to the method described with reference to FIG. 6E. Next, the processes described with reference to FIGS. 6F and 6G may be performed.

Heretofore, although the methods of fabricating the integrated circuit devices 100, 200A, 200B, 300, and 400 shown in FIGS. 1A to 5 have been described, embodiments are not limited thereto, and various changes and modifications may be made without departing from the scope of the above descriptions.

Figure 11:
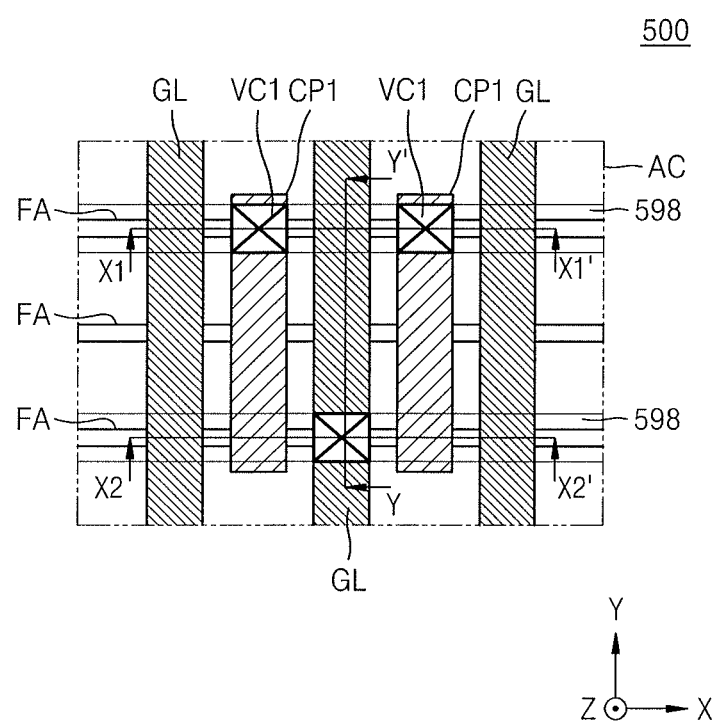
FIG. 11 illustrates a schematic layout diagram of an integrated circuit device according to further embodiments.
Figure 12A:
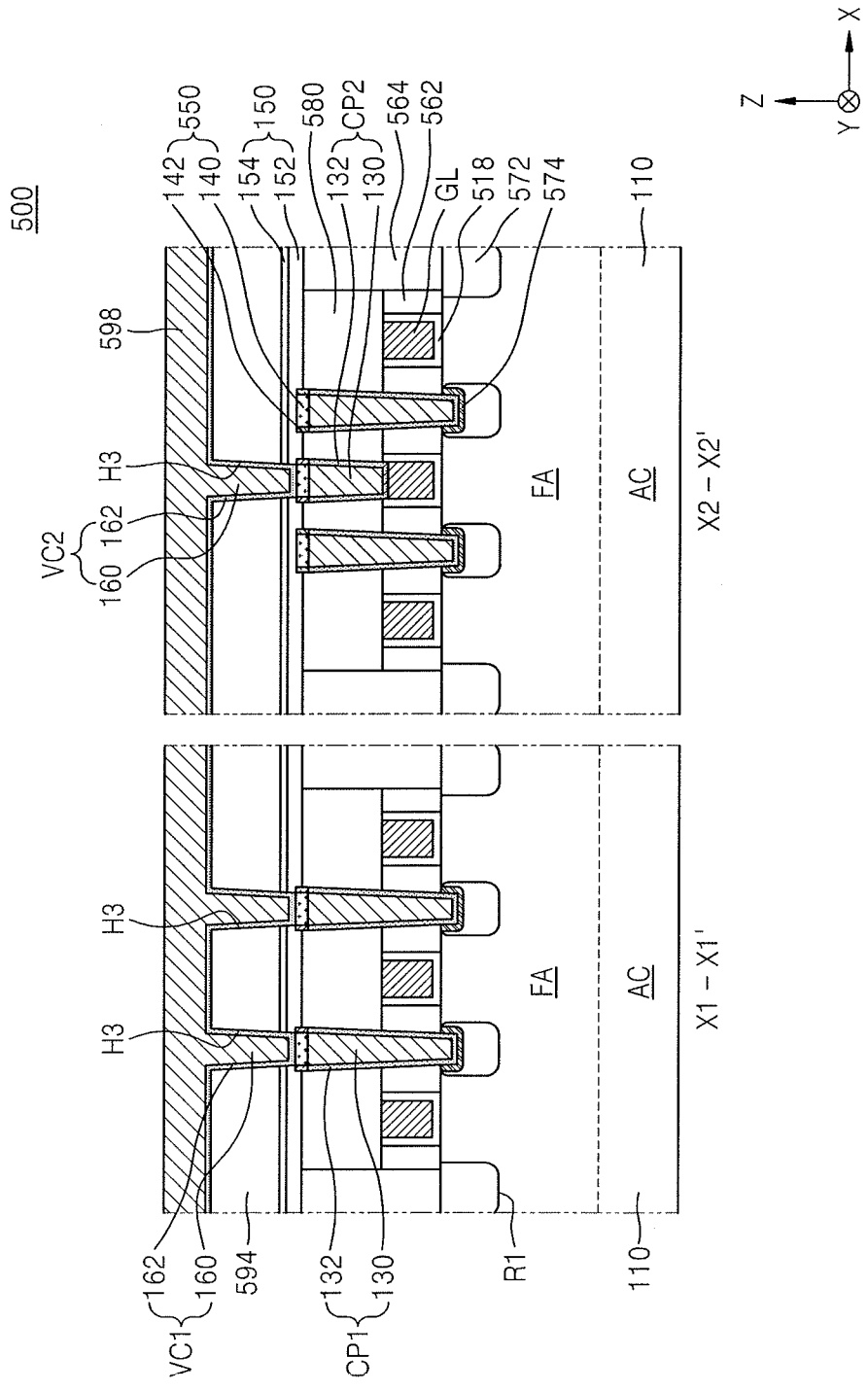
FIG. 12A illustrates cross-sectional views along lines X1-X1' and X2-X2' of FIG. 11.
Figure 12B:
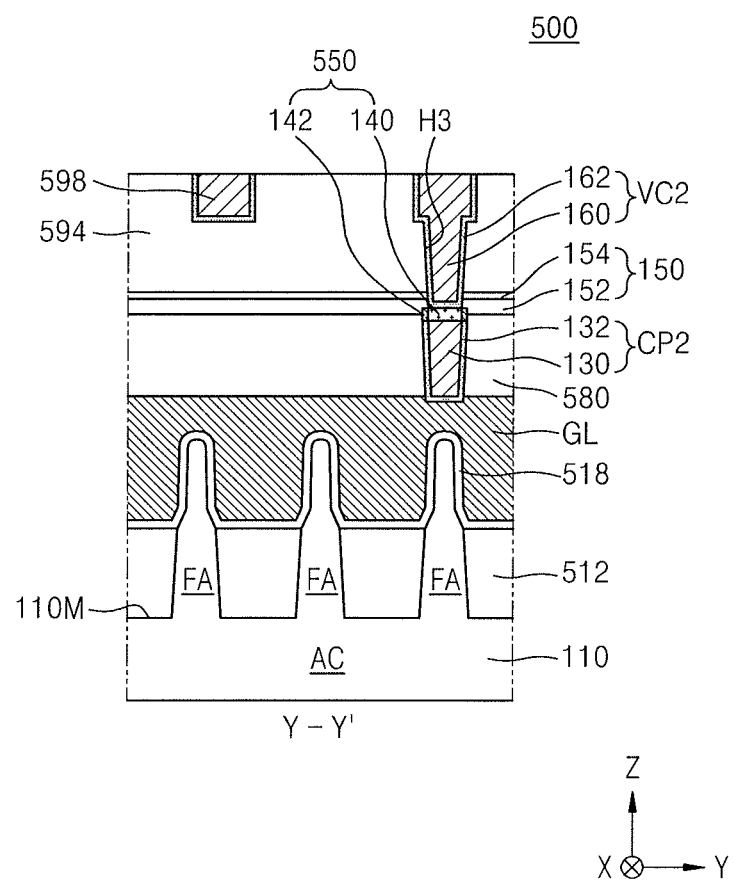
FIG. 12B illustrates a cross-sectional view along line Y-Y' of FIG. 11.

FIGS. 11, 12A, and 12B are diagrams illustrating an integrated circuit device according to further embodiments. FIG. 11 is a schematic layout diagram of an integrated circuit device 500, FIG. 12A illustrates cross-sectional views of the integrated circuit device 500, respectively taken along lines X1-X1' and X2-X2' of FIG. 11, and FIG. 12B illustrates a cross-sectional view of the integrated circuit device 500, taken along a line Y-Y' of FIG. 11. The integrated circuit device 500 shown in FIGS. 11, 12A, and 12B may constitute a logic cell including a fin field effect transistor (FinFET) device.

Referring to FIGS. 11, 12A, and 12B, the substrate 110 having a main surface 110M extending in horizontal directions (X direction and Y direction) may include a device active region AC. In the device active region AC of the substrate 110, a plurality of fin-type active regions FA protrude from the substrate 110. The plurality of fin-type active regions FA may extend parallel to each other along one direction (X direction). An isolation insulating film 512 may be formed on the device active region AC and between the plurality of fin-type active regions FA. The plurality of fin-type active regions FA protrude in a fin shape upwards from the isolation insulating film 512.

A gate insulating film 518 and a plurality of gate lines GL may extend over the substrate 110 in a direction (Y direction) intersecting the plurality of fin-type active regions FA. The gate insulating film 518 and the plurality of gate lines GL may extend while covering a top surface and both sidewalls of each of the plurality of fin-type active regions FA and a top surface of the isolation insulating film 512.

A plurality of MOS transistors may be formed along the plurality of gate lines GL on the device active region AC. Each of the plurality of MOS transistors may be a 3-dimensional-structured MOS transistor in which a channel is formed on the top surface and both sidewalls of each of the plurality of fin-type active regions FA.

The gate insulating film 518 may include, e.g., a silicon oxide film, a high-K dielectric film, or a combination thereof. The high-K dielectric film may include a material having a greater dielectric constant than a silicon oxide film. For example, the gate insulating film 518 may have a dielectric constant of about 10 to about 25. The high-K dielectric film may include a metal oxide or a metal oxynitride. For example, the high-K dielectric film may include at least one of, e.g., hafnium oxide, hafnium oxynitride, hafnium silicon oxide, lanthanum oxide, lanthanum aluminum oxide, zirconium oxide, zirconium silicon oxide, tantalum oxide, titanium oxide, and combinations thereof, without being limited thereto. In some embodiments, an interfacial layer may be arranged between the fin-type active regions FA and the gate insulating film 518. The interfacial layer may include an insulating material, e.g., an oxide film, a nitride film, or an oxynitride film.

The plurality of gate lines GL may include a work function metal-containing layer. The work function metal-containing layer may include at least one metal among, e.g., Ti, W, Ru, Nb, Mo, Hf, Ni, Co, Pt, Yb, Tb, Dy, Er, and Pd. The plurality of gate lines GL may further include a gap-fill metal film, which covers the work function metal-containing layer. The gap-fill metal film may include a W film or an Al film. In some embodiments, although each of the plurality of gate lines GL may include, e.g., a stacked structure of TiAlC/TiN/W, a stacked structure of TiN/TaN/TiAlC/TiN/W, or a stacked structure of TiN/TaN/TiN/TiAlC/TiN/W, embodiments are not limited thereto.

Both sidewalls of each of the plurality of gate lines GL are covered with an insulating spacer 562. The insulating spacer 562 may extend parallel to the gate lines GL along a length direction of the gate lines GL (Y direction). The insulating spacer 562 may include, e.g., a silicon nitride film, a SiOCN film, a SiCN film, or a combination thereof.

Each of the plurality of gate lines GL may be covered with a gate insulating capping layer 580, and an inter-gate dielectric 564 may be arranged between the plurality of gate lines GL. Each gate insulating capping layer 580 may vertically overlap a gate line GL and the insulating spacer 562, and may extend parallel to the gate line GL. The gate insulating capping layer 580 may include a silicon nitride film, without being limited thereto. The inter-gate dielectric 564 may include a silicon oxide film. The gate insulating capping layer 580 and the inter-gate dielectric 564 are covered with an insulating capping layer 150. The insulating capping layer 150 may have a multilayer structure in which a first insulating capping layer 152 and a second insulating capping layer 154 are stacked in this stated order. For descriptions of the insulating capping layer 150, reference may be made to the descriptions made with reference to FIGS. 1A to 1C.

A plurality of source/drain regions 572 may be formed in the plurality of fin-type active regions FA at both sides of the plurality of gate lines GL. The plurality of source/drain regions 572 may include a semiconductor epitaxial layer, which is epitaxially grown on a plurality of recess regions R1 in each fin-type active region FA. The plurality of source/drain regions 572 may include an epitaxially grown Si layer, an epitaxially grown SiC layer, or a plurality of epitaxially grown SiGe layers. When transistors formed on the plurality of fin-type active regions FA are NMOS transistors, the plurality of source/drain regions 572 may include an epitaxially grown Si layer or an epitaxially grown SiC layer, and may include N-type impurities. When the transistors formed on the plurality of fin-type active regions FA are PMOS transistors, the plurality of source/drain regions 572 may include an epitaxially grown SiGe layer, and may include P-type impurities. Some regions among the plurality of source/drain regions 572 may be covered with the inter-gate dielectric 564.

At least one first conductive plug CP1 connected to a source/drain region 572, and at least one second conductive plug CP2 connected to a gate line GL may be arranged over the plurality of fin-type active regions FA. The first conductive plug CP1 may constitute a source/drain contact, and the second conductive plug CP2 may constitute a gate contact.

Each first conductive plug CP1 may extend in a direction crossing the plurality of fin-type active regions FA. FIG. 11 illustrates an example of the first conductive plug CP1 formed over three fin-type active regions FA to cross the three fin-type active regions FA in a Y direction. A metal silicide layer 574 may be arranged between the source/drain region 572 and the first conductive plug CP1. The metal silicide layer 574 may include Ti silicide or Ta silicide, without being limited thereto. The second conductive plug CP2 may contact a top surface of the gate line GL through the gate insulating capping layer 580. Each of the first conductive plug CP1 and the second conductive plug CP2 may include the lower wiring layer 130 and the lower conductive barrier film 132, which have been described with reference to FIGS. 1A to 1C.

A top surface of each of the first conductive plug CP1 and the second conductive plug CP2 is covered with a metal-containing conductive capping layer 550. The metal-containing conductive capping layer 550 may include the first metal silicide capping layer 140 and the second metal silicide capping layer 142, which have been described with reference to FIGS. 1A to 1C. A top surface of each of the metal-containing conductive capping layer 550, the gate insulating capping layer 580, and the inter-gate dielectric 564 is covered with the insulating capping layer 150. The insulating capping layer 150 may have a multilayer structure in which the first insulating capping layer 152 and the second insulating capping layer 154 are stacked in this stated order. For the descriptions of the insulating capping layer 150, reference may be made to the descriptions made with reference to FIGS. 1A to 1C.

An upper insulating film 594 may be formed on the insulating capping layer 150. The integrated circuit device 500 may include: at least one first conductive via contact VC1, which is connected to the first conductive plug CP1 through the upper insulating film 594 and the insulating capping layer 150; a second conductive via contact VC2, which is connected to the second conductive plug CP2 through the upper insulating film 594 and the insulating capping layer 150; and a plurality of wiring layers 598 on the upper insulating film 594, the plurality of wiring layers 598 being connected to the first conductive via contact VC1 and the second conductive plug CP2. In some embodiments, a plurality of first conductive via contacts VC1 and some wiring layers 598 among the plurality of wiring layers 598 may be formed as one body. In addition, the second conductive via contact VC2 and some other wiring layers 598 among the plurality of wiring layers 598 may be formed as one body. Each of the first conductive via contact VC1, the second conductive via contact VC2, and the plurality of wiring layers 598 may have a structure including the upper wiring layer 160 and the upper conductive barrier film 162, which have been described with reference to FIGS. 1A to 1C.

Each of the lower wiring layer 130, which constitutes the first conductive plug CP1 and the second conductive plug CP2, and the upper wiring layer 160, which constitutes the first conductive via contact VC1 and the second conductive via contact VC2, may include the same or different metal. In some embodiments, although the lower wiring layer 130 may include Co and the upper wiring layer 160 may include Co, Cu, or W, embodiments are not limited thereto.

The upper insulating film 594 may include a silicon oxide film. For example, the upper insulating film 594 may include a tetraethyl orthosilicate (TEOS) film, or an ultra low-K (ULK) film having an ultra low dielectric constant K of about 2.2 to about 2.4. The ULK film may include a SiOC film or a SiCOH film.

In the integrated circuit device 500, the top surface of each of the first conductive plug CP1 and the second conductive plug CP2 is covered with the metal-containing conductive capping layer 550 including the first metal silicide capping layer 140 and the second metal silicide capping layer 142. Thus, during a process of forming a hole H3 by etching the upper insulating film 594 and the insulating capping layer 150 in order to form the first conductive via contact VC1 and the second conductive via contact VC2, the first metal silicide capping layer 140 is exposed by the hole H3, and since the lower wiring layer 130 is covered with the first metal silicide capping layer 140, there is no concern that the lower wiring layer 130 is exposed by the hole H3. Therefore, since the lower wiring layer 130 is protected by the first metal silicide capping layer 140 during the formation of the hole H3, physical deterioration of the lower wiring layer 130 may be suppressed, and thus, resistance increase, leakage current or the like in the lower wiring layer 130 may be suppressed, thereby improving the reliability of the integrated circuit device 500 including the lower wiring layer 130.

In the integrated circuit device 500 described with reference to FIGS. 11, 12A, and 12B, although an example, in which the insulating capping layer 150 as well as the metal-containing conductive capping layer 550 including the first metal silicide capping layer 140 and the second metal silicide capping layer 142 covers the top surface of each of the first conductive plug CP1 and the second conductive plug CP2, is described, embodiments are not limited thereto. In some embodiments, the metal-containing conductive capping layer 550 of the integrated circuit device 500 may include the first metal silicide capping layer 340 having a multilayer structure as shown in FIG. 4, instead of the first metal silicide capping layer 140. In some other embodiments, the integrated circuit device 500 may include the metal capping layer 440 shown in FIG. 5, as the metal-containing conductive capping layer 550. In some further embodiments, instead of the insulating capping layer 150 of the integrated circuit device 500, the insulating capping layer 250A shown in FIG. 2, the insulating capping layer 250B shown in FIGS. 3 and 4, or the insulating capping layer 450 shown in FIG. 5 may be used.

By way of summation and review, embodiments provide an integrated circuit device having a low-resistance wiring structure exhibiting improved reliability. That is, the integrated circuit device according to embodiments includes a metal-containing conductive capping layer between a lower wiring layer and an upper wiring layer. The metal-containing conductive capping layer protects the lower wiring layer from being exposed or damaged by a contact hole for forming the upper wiring layer when the contact hole is formed. Thus, physical deterioration of the lower wiring layer is suppressed, whereby a structure capable of suppressing a resistance increase, leakage current, or the like in the lower wiring layer may be provided, and the reliability of the integrated circuit device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
   an insulating film on a substrate;
   a lower wiring layer penetrating at least a portion of the insulating film, the lower wiring layer including a first metal;
   a lower conductive barrier film surrounding a bottom surface and a sidewall of the lower wiring layer, the lower conductive barrier film including a second metal different from the first metal;
   a first metal silicide capping layer covering a top surface of the lower wiring layer, the first metal silicide capping layer including the first metal;
   a second metal silicide capping layer contacting the first metal silicide capping layer and disposed on the lower conductive barrier film, the second metal silicide capping layer including the second metal;
   an insulating capping layer on the first metal silicide capping layer and on the second metal silicide capping layer, the insulating capping layer including silicon, the insulating capping layer covering a top surface of the first metal silicide capping layer, a top surface of the second metal silicide capping layer, and a top surface of the insulating film; and
   an upper wiring layer penetrating the insulating capping layer and connected to the lower wiring layer via the first metal silicide capping layer, the upper wiring layer including a metal that is different from the first metal.

2. The integrated circuit device as claimed in claim 1, wherein the first metal silicide capping layer includes:
   a first lower metal silicide capping layer including the first metal; and
   a first upper metal silicide capping layer including a third metal that is different from the first metal, the first lower metal silicide capping layer being between the lower wiring layer and the first upper metal silicide capping layer.

3. The integrated circuit device as claimed in claim 2, wherein the third metal includes a metal that is the same as the second metal.

4. The integrated circuit device as claimed in claim 1, further comprising:
   a gate line on the substrate; and
   a pair of source/drain regions at opposite sides of the gate line,
   wherein the lower wiring layer is connected to one of the gate line and the pair of source/drain regions.

5. The integrated circuit device as claimed in claim 1, wherein the insulating capping layer is a single layer including a silicon film.

6. The integrated circuit device as claimed in claim 1, wherein the insulating capping layer includes a silicon film, a nitride film, a carbide film, or a combination thereof.

7. The integrated circuit device as claimed in claim 1, wherein the insulating capping layer is a multilayer including a silicon film, an insulating film including a metal, and a nitride film including no metal.

8. An integrated circuit device, comprising:
   a fin-type active region protruding upward from a substrate;
   a plurality of source/drain regions filling a plurality of recess regions in the fin-type active region;
   a gate line on the fin-type active region, the gate line extending in a direction intersecting the fin-type active region;
   a source/drain contact connected to a top surface of one source/drain region from among the plurality of source/drain regions; and
   a gate contact connected to a top surface of the gate line, wherein at least one of the source/drain contact and the gate contact includes:
a lower wiring layer having a first metal,
a lower conductive barrier film surrounding a bottom surface and a sidewall of the lower wiring layer and having a second metal that is different from the first metal,
a first metal silicide capping layer covering a top surface of the lower wiring layer and having the first metal, and
a second metal silicide capping layer contacting the first metal silicide capping layer, disposed on the lower conductive barrier film, and having the second metal.

9. The integrated circuit device as claimed in claim 8, wherein the first metal silicide capping layer includes a first lower metal silicide capping layer and a first upper metal silicide capping layer which are stacked on the lower wiring layer in this stated order, the first lower metal silicide capping layer and the first upper metal silicide capping layer including different metals from each other.

10. The integrated circuit device as claimed in claim 9, wherein the first lower metal silicide capping layer includes Co silicide, and the first upper metal silicide capping layer includes Ti silicide.

11. The integrated circuit device as claimed in claim 8, wherein the first metal silicide capping layer includes Co silicide, and the second metal silicide capping layer includes Ti silicide.

12. The integrated circuit device as claimed in claim 8, further comprising:
an insulating capping layer covering a top surface of the first metal silicide capping layer, a top surface of the second metal silicide capping layer, and the gate line and including a silicon film; and
an upper wiring layer penetrating the insulating capping layer and connected to the lower wiring layer via the first metal silicide capping layer, the upper wiring layer including a metal that is different from the first metal.

13. An integrated circuit device, comprising:
an insulating film on a substrate;
a lower wiring layer penetrating at least a portion of the insulating film, the lower wiring layer including a first metal;
a lower conductive barrier film surrounding a bottom surface and a sidewall of the lower wiring layer, the lower conductive barrier film including a second metal different from the first metal;
a first metal silicide capping layer covering a top surface of the lower wiring layer, the first metal silicide capping layer including the first metal, and a top surface of the insulating film being at a higher level than a bottom surface of the first metal silicide capping layer and at a lower level than a top surface of the first metal silicide capping layer; and
a second metal silicide capping layer disposed on a top surface of the lower conductive barrier film and including the second metal, lateral side surfaces of the first and second metal silicide capping layers being in contact with each other.

14. The integrated circuit device as claimed in claim 13, wherein the first and second metal silicide capping layers completely cover the top surfaces of the lower wiring layer and the lower conductive barrier film, respectively.

15. The integrated circuit device as claimed in claim 13, further comprising:
an insulating capping layer on the lower wiring layer; and
an upper wiring layer through the insulating capping layer, the first metal silicide capping layer being between the lower and upper wiring layers.

16. The integrated circuit device as claimed in claim 15, wherein the upper wiring layer is connected to the lower wiring layer via the first metal silicide capping layer, the upper wiring layer including a metal different from the first metal.

17. The integrated circuit device as claimed in claim 15, wherein the top surface of the lower wiring layer is wider than a bottom surface of the upper wiring layer, the first metal silicide capping layer completely separating between the lower and upper wiring layers.

* * * * *